US009868206B2

(12) United States Patent
Shimada et al.

(10) Patent No.: US 9,868,206 B2
(45) Date of Patent: *Jan. 16, 2018

(54) CARRIER DEVICE

(71) Applicant: DAIHEN CORPORATION, Osaka-shi, Osaka (JP)

(72) Inventors: Masaru Shimada, Osaka (JP); Sayako Takarabe, Osaka (JP); Hideki Matsuo, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/398,187

(22) Filed: Jan. 4, 2017

(65) Prior Publication Data

US 2017/0113345 A1    Apr. 27, 2017

Related U.S. Application Data

(60) Continuation of application No. 14/990,324, filed on Jan. 7, 2016, now Pat. No. 9,566,713, which is a (Continued)

(30) Foreign Application Priority Data

Nov. 8, 2010 (JP) ................. 2010-249606

(51) Int. Cl.
*H01L 21/677* (2006.01)
*B25J 9/04* (2006.01)
(Continued)

(52) U.S. Cl.
CPC ............... *B25J 9/043* (2013.01); *B25J 9/106* (2013.01); *B25J 9/1065* (2013.01);
(Continued)

(58) Field of Classification Search
CPC ........ B25J 19/0054; B25J 9/043; B25J 9/106; B25J 9/1065; B25J 11/00; B25J 11/0095;
(Continued)

(56) References Cited

U.S. PATENT DOCUMENTS 5,489,192 A    2/1996  Taniguchi
6,298,684 B1  10/2001  Mitsuyoshi
(Continued)

FOREIGN PATENT DOCUMENTS

JP          1187463 A    3/1999
JP       2001035902 A    2/2001
(Continued)

OTHER PUBLICATIONS

International Search Report for International Application No. PCT/JP2011/075312, dated Jan. 31, 2012, with English translation.
(Continued)

*Primary Examiner* — Dean Kramer
(74) *Attorney, Agent, or Firm* — Cantor Colburn LLP

(57) ABSTRACT

There is provided a carrier device that has a linkage arm mechanism, in particular, a carrier device that cools the linkage arm mechanism and can reduce the impact of radiation heat from a work that is in a high temperature state. A carrier device is a carrier device that includes a linkage arm mechanism and a pivot shaft, and the linkage arm mechanism includes lower arms and upper arms, and one ends of which are respectively connected to the lower arms, and horizontal movement members that support a work that is connected to the other ends of the upper arms, and cooling plates are respectively arranged between the upper arms, and the horizontal movement members.

9 Claims, 14 Drawing Sheets

Related U.S. Application Data division of application No. 13/884,117, filed as application No. PCT/JP2011/075312 on Nov. 2, 2011, now Pat. No. 9,259,841.

(51) Int. Cl.
*B25J 9/10* (2006.01)
*B25J 19/00* (2006.01)
*B65G 49/06* (2006.01)

(52) U.S. Cl.
CPC ........ *B25J 19/0054* (2013.01); *B65G 49/061* (2013.01); *B65G 49/067* (2013.01); *H01L 21/67742* (2013.01); *B65G 2249/02* (2013.01)

(58) Field of Classification Search
CPC B65G 49/061; B65G 49/067; B65G 2249/02; H01L 21/67109; H01L 21/67742
USPC .............................................. 414/744.5, 217
See application file for complete search history.

(56) References Cited

U.S. PATENT DOCUMENTS

| | | |
|---|---|---|
| 6,499,777 B1 | 12/2002 | Wang |
| 7,692,120 B2 | 4/2010 | Koike |
| 9,259,841 B2 | 2/2016 | Shimada et al. |
| 9,566,713 B2 * | 2/2017 | Shimada .................. B25J 9/043 |
| 2007/0166135 A1 | 7/2007 | Koike |
| 2008/0279656 A1 | 11/2008 | Uratani et al. |
| 2010/0224343 A1 | 9/2010 | Fukuma et al. |
| 2011/0182699 A1 | 7/2011 | Kurita et al. |

FOREIGN PATENT DOCUMENTS

| | | |
|---|---|---|
| JP | 2009153253 A | 7/2009 |
| JP | 2010177411 A | 8/2010 |
| WO | 2006062183 A1 | 6/2006 |

OTHER PUBLICATIONS

U.S. Non Final Office Action corresponding to U.S. Appl. No. 14/990,324; dated Apr. 14, 2016.

U.S. Non Final Office Action corresponding to U.S. Appl. No. 13/884,117; dated Apr. 17, 2015.

* cited by examiner

CARRIER DEVICE

CROSS REFERENCE TO RELATED APPLICATIONS

The present application is a continuation application of U.S. patent application Ser. No. 14/990,324, filed on Jan. 7, 2016, the entire contents of which are incorporated herein by reference and priority to which is hereby claimed. Ser. No. 14/990,324 is the divisional application of U.S. patent application Ser. No. 13/884,117, filed on Jul. 26, 2013, the entire contents of which are incorporated herein by reference and priority to which is hereby claimed. application Ser. No. 13/884,117 is the U.S. national stage of application No. PCT/JP2011/075312, filed on Nov. 2, 2011. Priority under 35 U.S.C. §119(a) and 35 U.S.C. §365(b) is claimed from Japanese Application No. 2010-249606, filed Nov. 8, 2010, the disclosure of which is also incorporated herein by reference.

TECHNICAL FIELD

The present invention relates to a technology of a carrier device that carries a substrate in a vacuum space.

BACKGROUND ART

Conventionally, the carrier device is known that carries a work such as a substrate in a vacuum space (for example, see patent document 1). The carrier device includes a linkage arm mechanism that horizontally moves the work in the vacuum space.

In addition, the radiation heat is conveyed to a peripheral member of the work because the work that is carried by the carrier device is in a high temperature state. Therefore, the carrier device is known that includes a rail mechanism and in which a cooling path is provided in a guide rail portion of the rail mechanism that is susceptible to the radiation heat from the work in the high temperature state (for example, see patent document 2).

RELATED ART DOCUMENTS

Patent Documents

[Patent Document 1] Japanese Unexamined Patent Application Publication No. 2009-153253.
[Patent Document 2] Japanese Unexamined Patent Application Publication No. 2010-177411.

DISCLOSURE OF THE INVENTION

Problems to be Solved by the Invention

When a work in a high temperature state is carried by the carrier device including the linkage arm mechanism, in particular, an upper arm and a lower arm are susceptible to the impact of the radiation heat from the work. When the upper arm and the lower arm are affected by the radiation heat from the work, portions of the upper arm and the lower arm are thermally expanded, so that the position accuracy and the trajectory accuracy are reduced. In addition, due to the impact of the radiation heat, it is probable that portions of the upper arm and the lower arm are deteriorated and damaged. In addition, due to the radiation heat, because lubrication oil that has been applied to the portions of the upper arm and the lower arm is dried off, it is probable that the portions of the upper arm and the lower arm are contaminated by the lubrication oil. When each of the upper arm and the lower arm is constituted by a material for which lubrication oil is not used, the cost increases.

Therefore, in view of the problems, the present invention provides a carrier device that includes a linkage arm mechanism, in particular, a carrier device that can cool the linkage arm mechanism and reduce the impact of radiation heat from a work in a high temperature state.

Means of Solving the Problems

The problems to be solved of the present invention are as described above, and subsequently, means of solving the problems are described.

That is, in at least an embodiment, a carrier device includes a linkage arm mechanism that is used to carry a work in a vacuum space and a pivot shaft that pivotally supports the linkage arm mechanism so that the linkage arm mechanism can rotate around a vertical shaft, and in the carrier device, the linkage arm mechanism includes lower arms, upper arms one ends of which are respectively connected to the lower arms, and horizontal movement members that support the work that is connected to the other ends of the upper arms, and cooling plates are respectively provided between the upper arms and the horizontal movement members, and reflective materials are stick on surfaces of the cooling plates on the horizontal movement member side.

In at least an embodiment, the cooling plates are provided on lower sides of the lower arms.

In at least an embodiment, the cooling plate is wound around the pivot shaft.

Effects of the Invention

As effects of the invention, the effects that are described below are demonstrated.

In at least an embodiment, the upper arm can be cooled by the cooling plate by providing the cooling plate between the upper arm of the linkage arm mechanism and the work in the high temperature state. Thus, the impact of the radiation heat from the work in the high temperature state can be reduced.

In addition, the radiation heat from the work can be reflected by sticking a reflective material on the surface of the side near the work in the high temperature state. Thus, the impact of the radiation heat from the work in the high temperature state can be reduced.

In at least an embodiment, even when the radiation heat from the work in the high temperature state is reflected in the vacuum space and is conveyed from the lower side of the linkage arm mechanism, the lower arm can be cooled using the cooling plate by providing the cooling plate on the lower side of the lower arm of the linkage arm mechanism. Thus, the impact of the radiation heat from the work in the high temperature state can be reduced.

In at least an embodiment, the pivot shaft that pivotally supports the linkage arm mechanism can be cooled using the cooling plate. Thus, the impact of the radiation heat from the work in the high temperature state can be reduced.

BEST MODE FOR CARRYING OUT THE INVENTION

The embodiments of the present invention are described below.

Figure 1:
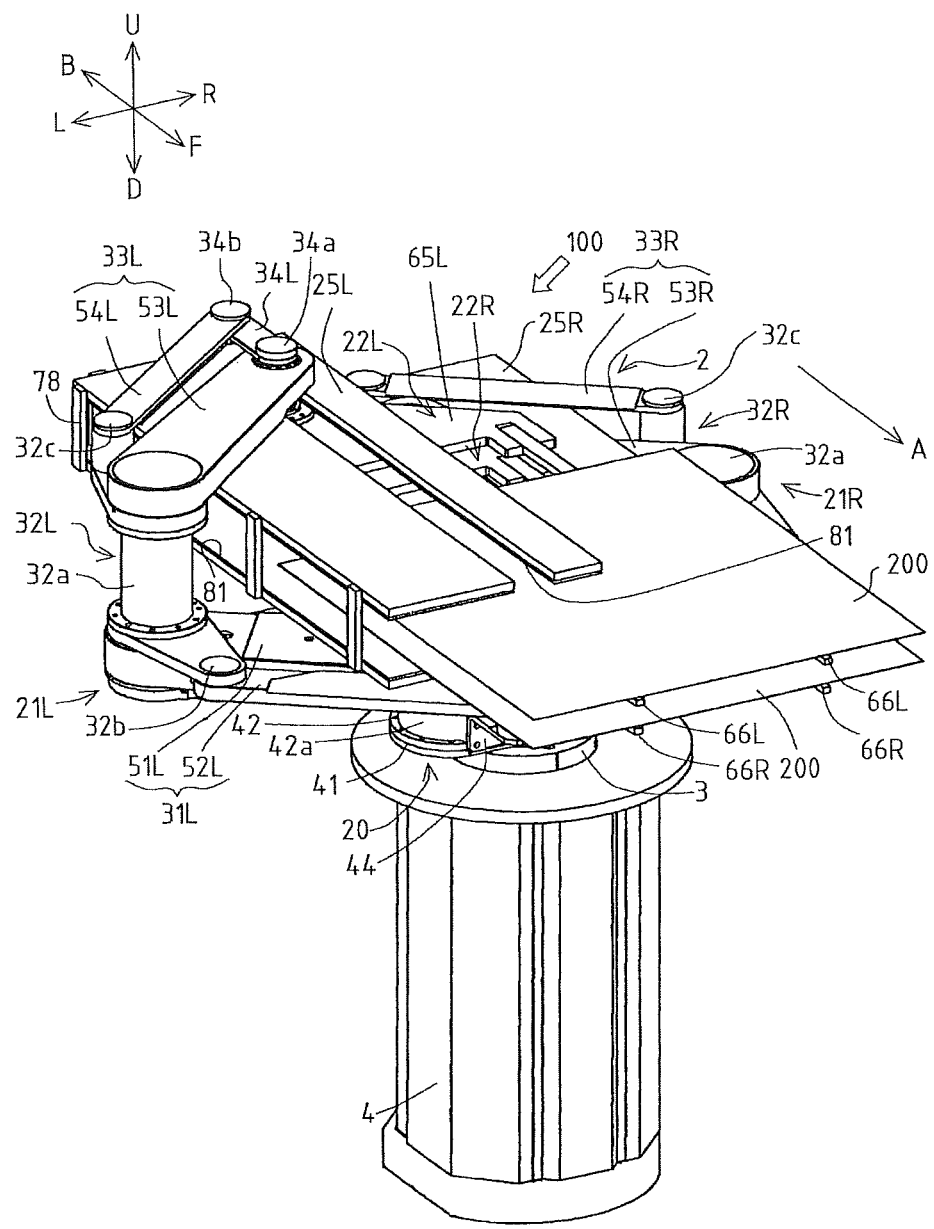
FIG. 1 is a left front perspective view of a carrier device according to an embodiment of the present invention.

First, the general arrangement of a carrier device 100 is described with reference to FIG. 1 to FIG. 5. It is noted that, in FIG. 1, an arrow A direction is set as a front direction, and directions that are indicated by arrow directions of FIG. 1 are respectively set as a back-and-forth direction, a left-and-right direction, and an up-and-down direction.

As illustrated in FIG. 1 to FIG. 5, the carrier device 100 includes a linkage arm mechanism 2 that is used to carry a work 200 in a vacuum space, and a pivot shaft 3 that pivotally supports the linkage arm mechanism 2 so that the linkage arm mechanism 2 can rotate around a vertical shaft.

The lower part of the pivot shaft 3 is fixedly installed in a housing 4. In addition, the linkage arm mechanism 2 is provided in the upper part of the pivot shaft 3. A drive unit that is not illustrated is provided inside the pivot shaft 3, and a left lower arm 31L and a right lower arm 31R of the linkage arm mechanism 2 are rotated and moved by driving the drive unit.

In addition, the entire linkage arm mechanism 2 can be rotated around the vertical shaft by rotating the pivot shaft 3. In addition, the pivot shaft 3 can be slid in the up-and-down direction with respect to the housing 4, and the pivot shaft 3 and the linkage arm mechanism 2 can be slid in the up-and-down direction.

The vacuum space that is used to carry the work 200 is provided above a boundary between the bottom surface of the pivot shaft 3 and the top surface of the housing.

The linkage arm mechanism 2 is a mechanism that moves the work 200 in the horizontal direction. In the embodiment, the work 200 is, for example, a substrate and a liquid crystal panel, and is formed in a plate-shape.

The linkage arm mechanism 2 is constituted by a pivot base 20, left and right linkage arms 21L and 21R, and left and right horizontal movement members 22L and 22R. The left linkage arm 21L includes the left lower arm 31L, a left intermediate linkage 32L, a left upper arm 33L, and a left horizontal movement member connection part 34L. In addition, the right linkage arm 21R includes the right lower arm 31R, a right intermediate linkage 32R, a right upper arm 33R, and a right horizontal movement member connection part 34R. It is noted that the configuration of the left and right linkage arms 21L and 21R is not limited to such a case, and alternatively, the left and right linkage arms 21L and 21R may be configured so that the left and the right are reversed.

Figure 4:
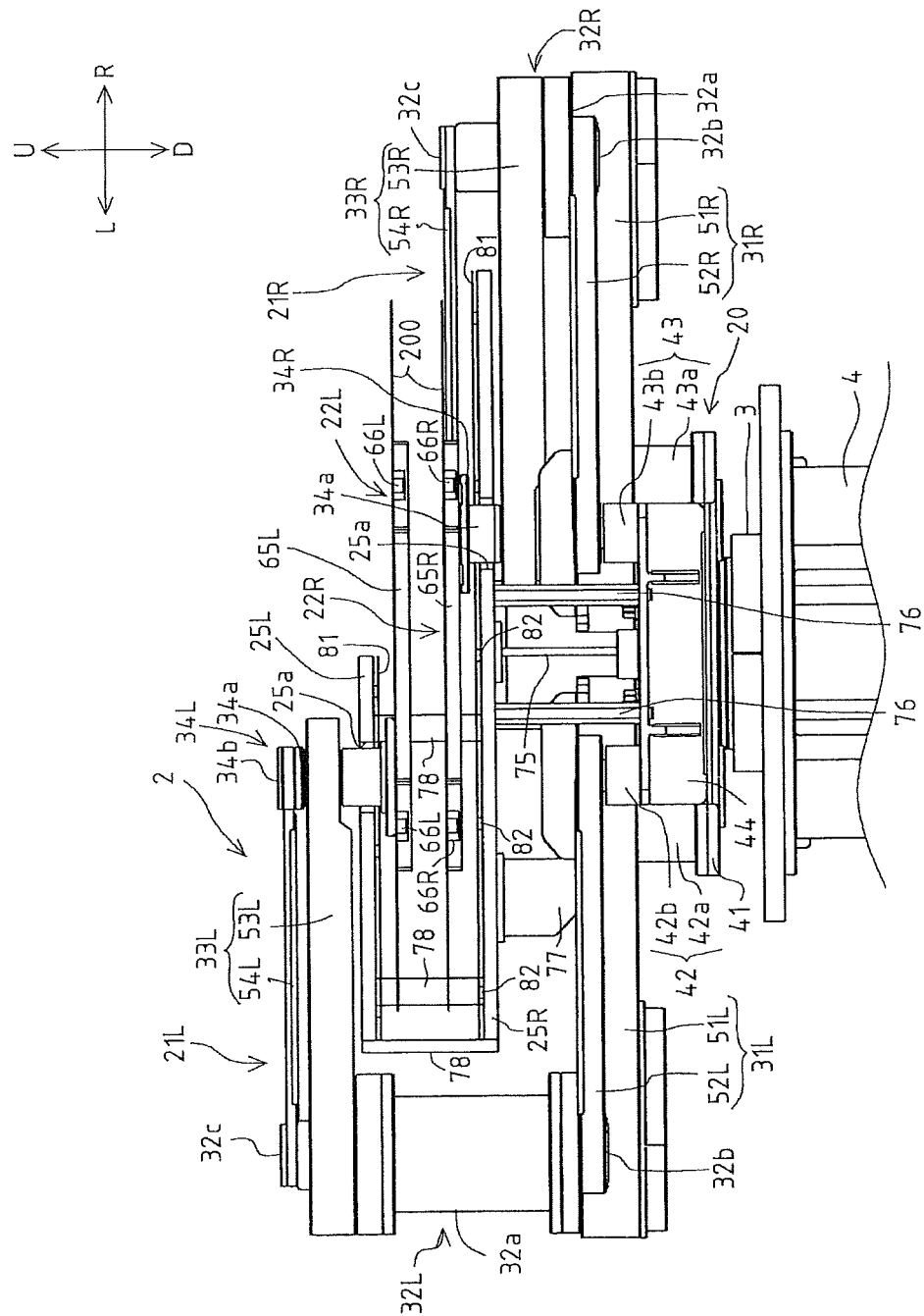
FIG. 4 is a front view of the carrier device.

The pivot base 20 is connected to the upper part of the pivot shaft 3. As illustrated in FIG. 4, the pivot shaft 3 includes a bottom plate 41, a left linkage arm rotary shaft part 42, a right linkage arm rotary shaft part 43, and a front apron part 44.

The bottom plate 41 is a plate-like member, and is connected to the pivot shaft 3 so that relative rotation of the bottom plate 41 cannot be performed with respect to the pivot shaft 3.

The left linkage arm rotary shaft part 42 is a central part of rotation of the left linkage arm 21L, and includes a drive shaft 42a and a driven shaft 42b. A drive shaft of the drive unit that is not illustrated is connected to the drive shaft 42a. The left lower arm 31L rotates and moves using the left linkage arm rotary shaft part 42 as the center of rotation by rotating the drive shaft 42a by the drive unit.

The right linkage arm rotary shaft part 43 is a central part of rotation of the right linkage arm 21R, and includes a drive shaft 43a and a driven shaft 43b. A drive shaft of the drive unit that is not illustrated is connected to the drive shaft 43a. The right lower arm 31R rotates and moves using the right linkage arm rotary shaft part 43 as the center of rotation by rotating the drive shaft 43b by the drive unit.

The drive shaft 42a and the drive shaft 43a are provided on the top surface of the bottom plate 41. The drive shaft 42a and the drive shaft 43a are located at positions that are shifted from the rotating shaft of the pivot shaft 3.

In addition, the front apron part 44 is fixedly installed on the front surface of the bottom plate 41. The front apron part 44 is a member having an approximately hook-shape in the side view, and the lower end of the front apron part 44 is fixedly installed on the front surface of the bottom plate 41. The driven shaft 42b and a driven shaft 43a are provided on the top surface of the front apron part 44.

The configuration of the left linkage arm 21L is described below with reference to FIG. 1, FIG. 3, FIG. 4 and FIG. 5.

The left lower arm 31L is constituted by a first arm member 51L and a second arm member 52L that are a pair of long plate-like members. A parallel linkage mechanism is constituted by the left lower arm 31L, the left linkage arm rotary shaft part 42, and the left intermediate linkage 32L.

A base end part of the first arm member 51L is connected to the drive shaft 42a of the left linkage arm rotary shaft part 42 so that relative rotation of the base end part cannot be performed with respect to the drive shaft 42a. In addition, a base end part of the second arm member 52L is rotatably connected to the driven shaft 42b. As a result, the left lower arm 31L rotates and moves using the left linkage arm rotary shaft part 42 as the center of rotation.

In addition, the other end part of the first arm member 51L is connected to an interlocking shaft 32a that is provided on the left intermediate linkage 32L so that relative rotation of the other end part cannot be performed with respect to the interlocking shaft 32a. The other end part of the second arm member 52L is rotatably connected to a rotary shaft 32b that is provided on the left intermediate linkage 32L.

The left intermediate linkage 32L is a member that connects the left lower arm 31L and the left upper arm 33L, and rotates the left upper arm 33L in conjunction with the movement of the left lower arm 31L. The left intermediate linkage 32L includes the interlocking shaft 32a and the rotary shafts 32b and 32c. An interlocking mechanism that is not illustrated is provided inside the interlocking shaft 32a.

The left upper arm 33L is constituted by a third arm member 53L and a fourth arm member 54L that are a pair of long plate-like members. A parallel linkage mechanism is constituted by the left upper arm 33L, the left intermediate linkage 32L, and the left horizontal movement member connection part 34L.

A base end part of the third arm member 53L is connected to the interlocking shaft 32a of the left intermediate linkage 32L so that relative rotation of the base end part cannot be performed with respect to the interlocking shaft 32a. In addition, a base end part of the fourth arm member 54L is rotatably connected to the rotary shaft 32c of the left intermediate linkage 32L. As a result, the third arm member 53L is rotated in conjunction with the movement of the first arm member 51L through an interlocking mechanism that is not illustrated, of the interlocking shaft 32a.

In addition, the other end part of the third arm member 53L is connected to a support shaft 34a that is provided on the left horizontal movement member connection part 34L so that relative rotation of the other end part cannot be performed with respect to the support shaft 34a. The other end part of the fourth arm member 54L is rotatably connected to a rotary shaft 34b that is provided on the left horizontal movement member connection part 34L.

The left horizontal movement member 22L includes a horizontal movement base 65L and a hook 66L.

The horizontal movement base 65L is a lower part of the support shaft 34a of the left horizontal movement member connection part 34L, and is connected to the lower side of a third arm member 53R. The horizontal movement base 65L is formed into a plate shape, and the left and right two hooks 66L and 66L are installed on the front end of the horizontal movement base 65L in a protruding manner.

The hooks 66L and 66L are thin plate-like members, and the work 200 can be mounted on the top surfaces of the hooks 66L and 66L.

By such a configuration, when the first arm member 51L is rotated around a vertical shaft of the drive shaft 42a, the second arm member 52L rotates so as to keep parallel to the first arm member 51L, so that the left intermediate linkage 32L horizontally moves on a circle the radius of which is the first arm member 51L.

In addition, the third arm member 53L rotates so as to keep parallel to the fourth arm member 54L in conjunction with the movement of the first arm member 51L, so that the left horizontal movement member connection part 34L horizontally moves in the back-and-forth direction.

As described above, the left horizontal movement member 22L can be horizontally moved in the back-and-forth direction by performing a linkage operation to elongate and retract the left lower arm 31L and the left upper arm 33L.

Figure 2:
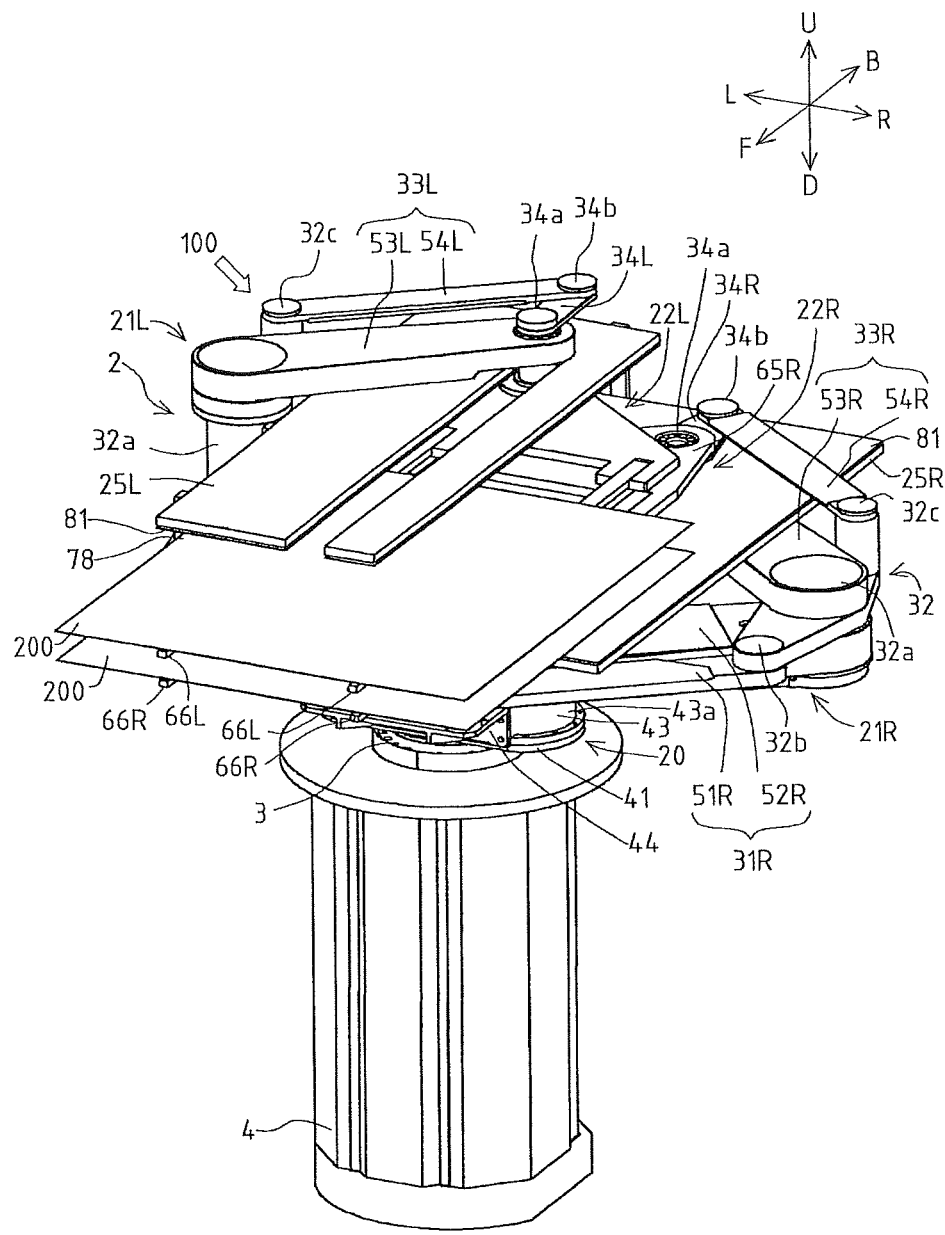
FIG. 2 is a right front perspective view of the carrier device.
Figure 3:
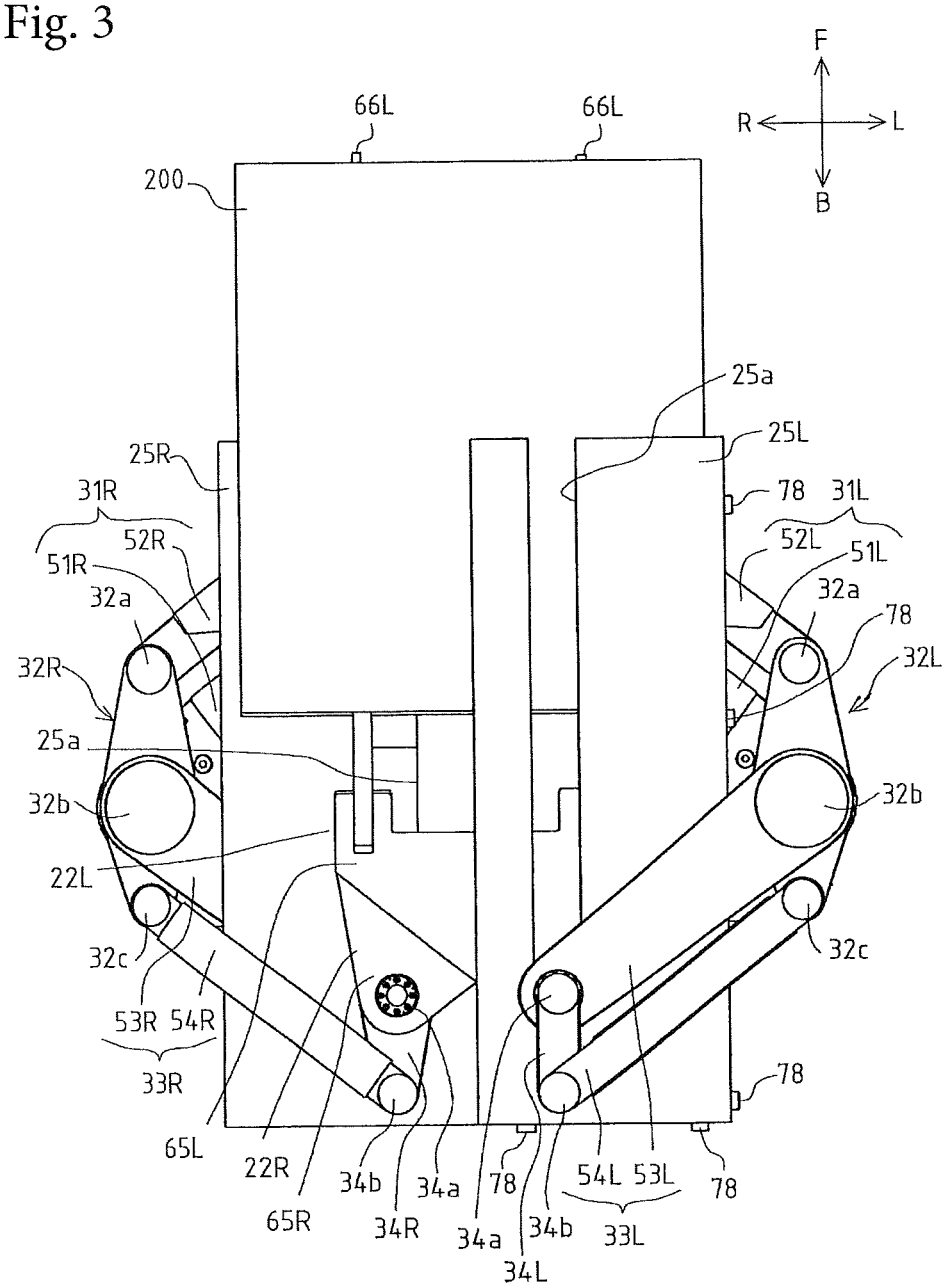
FIG. 3 is a plan view of the carrier device.

The configuration of the right linkage arm 21R is described below with reference to FIG. 2 and FIG. 4.

The right lower arm 31R is constituted by a first arm member 51R and a second arm member 52R that are a pair of long plate-like members. A parallel linkage mechanism is constituted by the right lower arm 31R, the right linkage arm rotary shaft part 43, and the right intermediate linkage 32R.

A base end part of the first arm member 51R is connected to the drive shaft 43a of the right linkage arm rotary shaft part 43 so that relative rotation of the base end part cannot be performed with respect to the drive shaft 43a. In addition, a base end part of the second arm member 52R is rotatably connected to the driven shaft 43b. As a result, the right lower arm 31R rotates and moves using the right linkage arm rotary shaft part 43 as the center of rotation.

In addition, the other end part of the first arm member 51R is connected to the interlocking shaft 32a that is provided on the right intermediate linkage 32R so that relative rotation of the other end part cannot be performed with respect to the interlocking shaft 32a. The other end part of the second arm member 52R is rotatably connected to the rotary shaft 32b that is provided on the right intermediate linkage 32R.

The right intermediate linkage 32R is a member that connects the right lower arm 31R and the right upper arm 33R and rotates the right upper arm 33R in conjunction with the movement of the right lower arm 31R. The right intermediate linkage 32R includes the interlocking shaft 32a, and the rotary shafts 32b and 32c. An interlocking mechanism that is not illustrated is provided inside the interlocking shaft 32a. In addition, the length in the up-and-down direction of the interlocking shaft 32a of the right intermediate linkage 32R is formed to be shorter than that of the interlocking shaft 32a of the left intermediate linkage 32L. As a result, the right upper arm 33R, the right horizontal movement member connection part 34R, and the right horizontal movement member 22R are respectively located at positions that are lower than the left upper arm 33L, the left horizontal movement member connection part 34L, and the left horizontal movement member 22L.

The right upper arm 33R is constituted by the third arm member 53R and a fourth arm member 54R that are a pair of long plate-like members. A parallel linkage mechanism is constituted by the right upper arm 33R, the right intermediate linkage 32R, and the right horizontal movement member connection part 34R.

A base end part of the third arm member 53R is connected to the interlocking shaft 32a of the right intermediate linkage 32R so that relative rotation of the base end part cannot be performed with respect to the interlocking shaft 32a. In addition, a base end part of the fourth arm member 54R is rotatably connected to the rotary shaft 32c of the right intermediate linkage 32R. As a result, the third arm member 53R is rotated in conjunction with the movement of the first arm member 51R through an interlocking mechanism that is not illustrated, of the interlocking shaft 32a.

In addition, the other end part of the third arm member 53R is connected to the support shaft 34a that is provided on the right horizontal movement member connection part 34R so that relative rotation of the other end part cannot be performed with respect to the support shaft 34a. The other end part of the fourth arm member 54R is rotatably connected to the rotary shaft 34b that is provided on the right horizontal movement member connection part 34R.

The right horizontal movement member 22R includes a horizontal movement base 65R and a hook 66R.

The horizontal movement base 65R is the upper part of the support shaft 34a of the right horizontal movement member connection part 34R, and is connected to the upper side of the third arm member 53R. The horizontal movement base 65R is formed into a plate shape, and the left and right two hooks 66R and 66R are installed on the front end of the horizontal movement base 65R in a protruding manner.

The hooks 66R and 66R are thin plate-like members, and the work 200 can be mounted on the top surfaces of the hooks 66R and 66R.

By such a configuration, when the first arm member 51R is rotated around a vertical shaft of the drive shaft 43a, the second arm member 52R rotates so as to keep parallel to the first arm member 51R, so that the right intermediate linkage 32R horizontally moves on a circle the radius of which is the first arm member 51R.

In addition, the third arm member 53R rotates so as to keep parallel to the fourth arm member 54R in conjunction with the movement of the first arm member 51R, so that the right horizontal movement member connection part 34R horizontally moves in the back-and-forth direction.

As described above, the right horizontal movement member 22R can be horizontally moved in the back-and-forth direction by performing a linkage operation to elongate and retract the right lower arm 31R and the right upper arm 33R.

The positions in the up-and-down direction of the left and right horizontal movement members 22L and 22R are different, so that the left and right horizontal movement members 22L and 22R are overlapped at a certain distance without contacting each other.

Cooling plates 25L and 25R according to the embodiment are described below.

The cooling plates 25L and 25R are a left cooling plate 25L and a right cooling plate 25R that respectively correspond to the left and right linkage arms 21L and 21R.

Figure 6A:
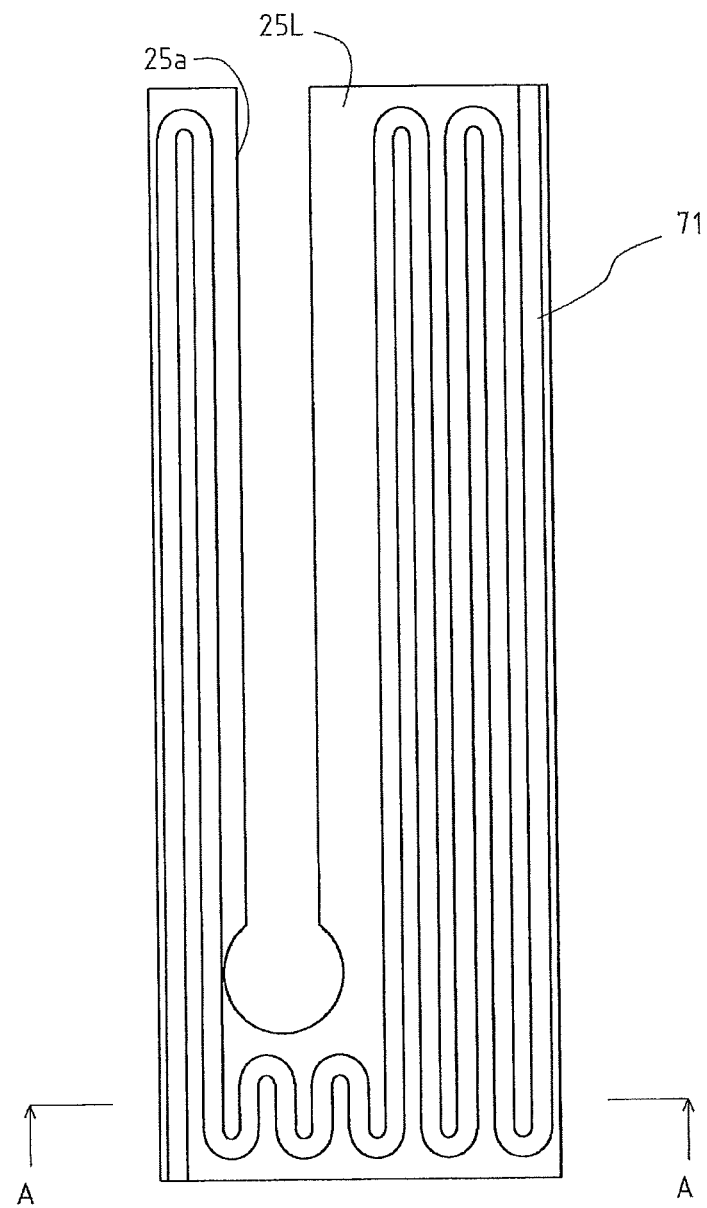
FIG. 6A is a plan view of a left cooling plate and FIG. 6B is a cross-sectional view of an A-A line.
Figure 6B:

The left cooling plate 25L is a plate-like member and a member having a color that is easy to absorb heat such as a black color. In addition, as illustrated in FIG. 6, a cooling path 71 is provided on the surface of the left cooling plate 25L. The cooling path 71 is fitted into a groove that is provided on the surface of the left cooling plate 25L. The left cooling plate 25L is provided so that the cooling path 71 is located on the top surface of the left cooling plate 25L. The cooling path 71 is bent in a zigzag and provided so as to cool the whole surface of the left cooling plate 25L. In addition, a cooling medium that flows into the cooling path 71 includes water, oil, and the like.

Figure 7A:
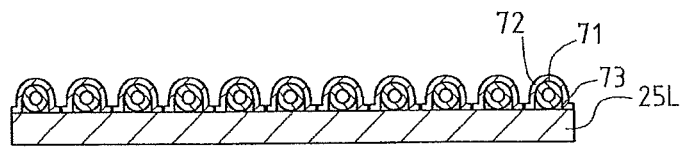
FIG. 7A is a cross-sectional view of an A-A line of a left cooling plate according to another embodiment and FIG. 7B is a cross-sectional view of an A-A line of a left cooling plate according to another embodiment.

In addition, as illustrated in FIG. 7A, the cooling path 71 may be installed on the surface of the left cooling plate 25L by an attachment tool 72. A filler 73 that is used to increase a heat transfer rate is filled in a space that is surrounded by the surface of the left cooling plate 25L, the outer peripheral surface of the cooling path 71, and the inner peripheral surface of the attachment tool 72. The cooling path 71 and the attachment tool 72 are bent in a zigzag and provided so as to cool the whole surface of the left cooling plate 25L.

Figure 7B:
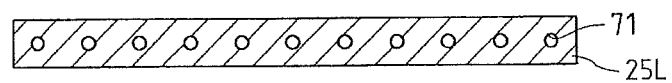

In addition, as illustrated in FIG. 7B, the cooling path 71 may be provided inside the left cooling plate 25L. The cooling path 71 is bent in a zigzag and provided so as to cool the whole surface of the left cooling plate 25L.

The left cooling plate 25L is provided below the third arm member 53L and the fourth arm member 54L and provided above the horizontal movement base 65L. That is, the left cooling plate 25L is provided between the surface of the left upper arm 33L on the left horizontal movement member 22L side and the left horizontal movement member 22L. In addition, the left cooling plate 25L includes an area that includes all movement ranges of the left upper arm 33L in the planar view. In addition, as illustrated in FIG. 4 and FIG. 6, a support shaft passing groove 25a having a width that is a little larger than the radius of the support shaft 34a is provided on the front side of the intermediate portion of the left cooling plate 25L in the left-and right direction in the planar view. The support shaft passing groove 25a is provided in a range in which the movement of the support shaft 34a in the back-and-forth direction is not interfered when the horizontal movement member 22L moves in the back-and-forth direction.

Figure 8A:
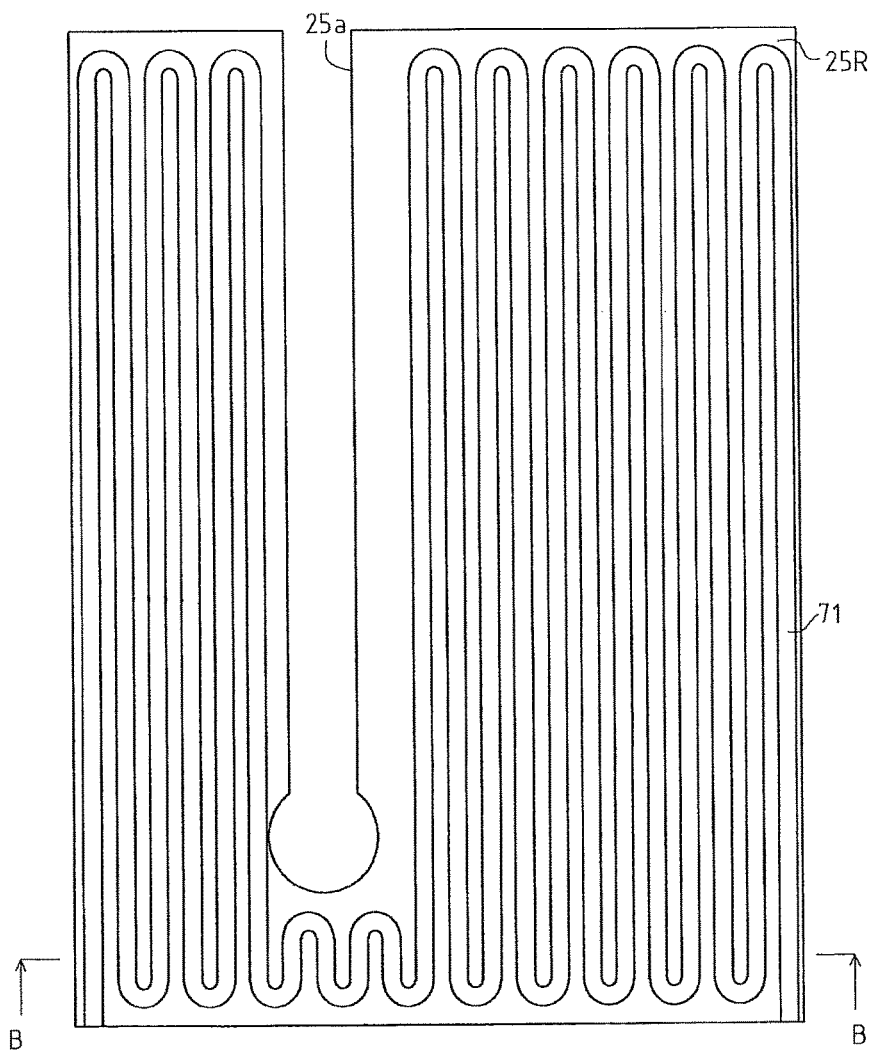
FIG. 8A is a plan view of a right cooling plate and FIG. 8B is a cross-sectional view of a B-B line.
Figure 8B:

In addition, the right cooling plate 25R is a plate-like member, and a member having a color that is easy to absorb heat such as a black color. In addition, the right cooling plate 25R has the same configuration as the left cooling plate 25L, and as illustrated in FIG. 8, the cooling path 71 is provided on the surface of the right cooling plate 25R. The right cooling plate 25R is provided so that the cooling path 71 is located on the bottom surface of the right cooling plate 25R. The cooling path 71 is bent in a zigzag and provided so as to cool the whole surface of the right cooling plate 25R. In addition, a cooling medium that flows into the cooling path 71 includes water, oil, and the like.

In addition, as illustrated in FIG. 7A, the cooling path 71 may be installed on the surface of the right cooling plate 25R by the attachment tool 72, similar to the cooling path 71 of the left cooling plate 25L. The filler 73 that is used to increase a heat transfer rate is filled in a space that is surrounded by the surface of the right cooling plate 25R, the outer peripheral surface of the cooling path 71, and the inner peripheral surface of the attachment tool 72. The cooling path 71 and the attachment tool 72 are bent in a zigzag and provided so as to cool the whole surface of the right cooling plate 25R.

In addition, as illustrated in FIG. 7B, the cooling path 71 may be provided inside the right cooling plate 25R. The cooling path 71 is bent in a zigzag and provided so as to cool the whole surface of the right cooling plate 25R.

The right cooling plate 25R is provided above the third arm member 53R and provided below the fourth arm member 54R and the horizontal movement base 65R. That is, the right cooling plate 25R is provided between the surface of the right upper arm 33R on the right horizontal movement member 22R side and the right horizontal movement member 22R. In addition, the right cooling plate 25R includes an area that includes all movement ranges of the right upper arm 33R in the planar view. In addition, as illustrated in FIG. 4 and FIG. 8, the support shaft passing groove 25a having a width that is a little larger than the radius of the support shaft 34a is provided on the front right side of the right cooling plate 25R in the left-and right direction in the planar view. The support shaft passing groove 25a is provided in a range in which the movement of the support shaft 34a in the back-and-forth direction is not interfered when the horizontal movement member 22L moves in the back-and-forth direction.

Figure 5:
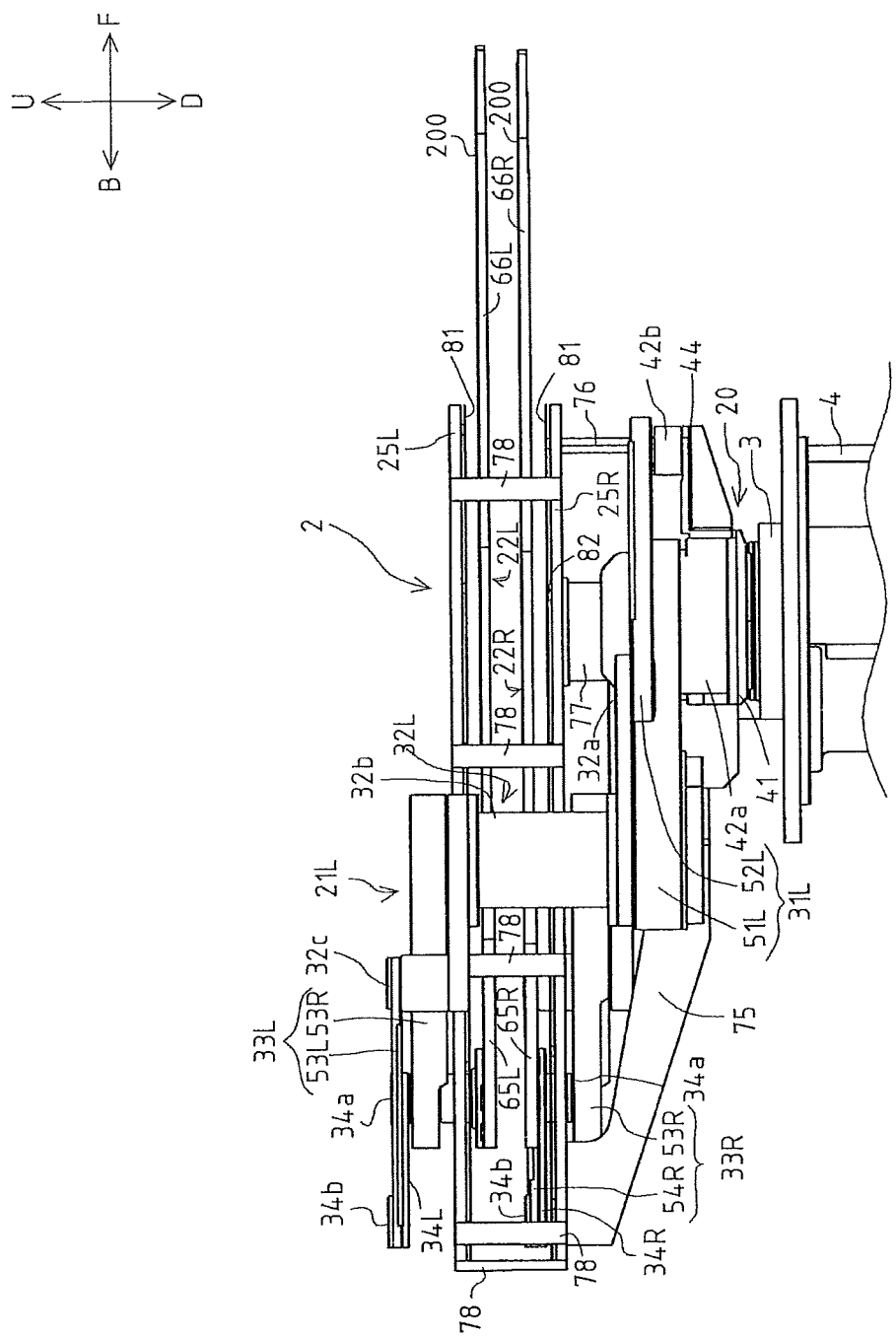
FIG. 5 is a left side view of the carrier device.

A supporting method of the right cooling plate 25R and the left cooling plate 25L is described below. As illustrated in FIG. 4 and FIG. 5, a first cooling plate supporting member 75 is provided to project into the rear and above from the rear surface of the bottom plate 41 of the pivot base 20. A second cooling plate supporting members 76 and 76 are two columnar members and are provided to project upward from the top surface of the front apron part 44. In addition, a third cooling plate supporting member 77 is provided to project upward from the drive shaft 42a of the left linkage arm rotary shaft part 42. The right cooling plate 25R is supported from below by the first cooling plate supporting member 75, the second cooling plate supporting members 76 and 76, and the third cooling plate supporting member 77.

In addition, a plurality of left cooling plate supporting members 78, 78, 78, and 78 are provided to stand on the left side surface and the rear surface of the right cooling plate 25R. The left cooling plate 25L is fixed on the upper parts of the left cooling plate supporting members 78, 78, 78, and 78 and supported from below by the left cooling plate supporting members.

A reflective material 81 is stuck on the bottom surface of the left cooling plate 25L. That is, the reflective material 81 is stuck on the surface of the left cooling plate 25L on the left horizontal movement member 22L side. The reflective material 81 is stuck on the left cooling plate 25L by a plurality of adhesive members 82. The reflective material 81 is constituted by a thin metal plate that can reflect the radiation heat from the work 200.

In addition, the reflective material 81 having a similar thin metal plate is stuck on the top surface of the right cooling plate 25R. That is, the reflective material 81 is stuck on the surface of the right cooling plate 25R on the right horizontal movement member 22R side.

Second Embodiment

Figure 9:
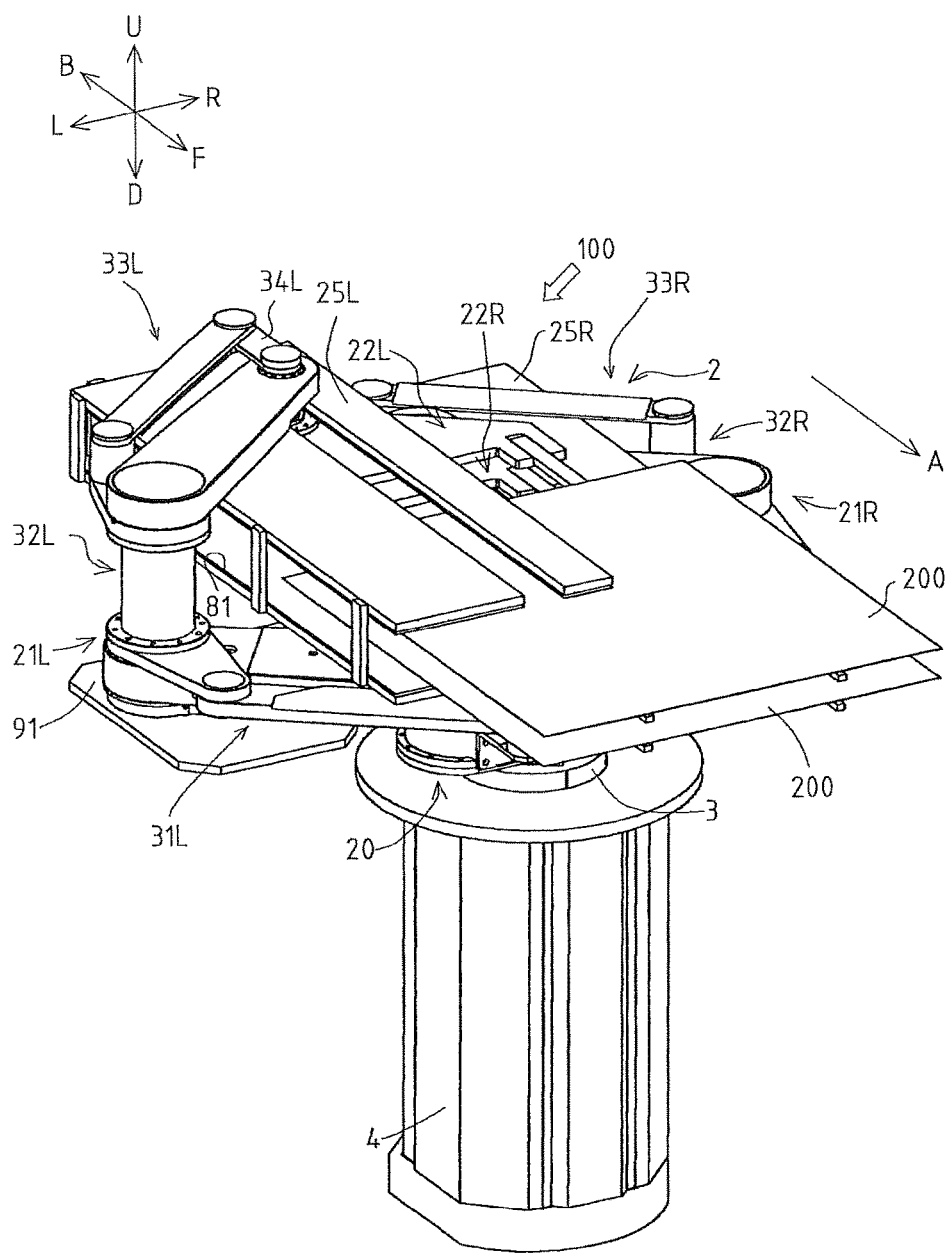
FIG. 9 is a left front perspective view of a carrier device according to a second embodiment.
Figure 10:
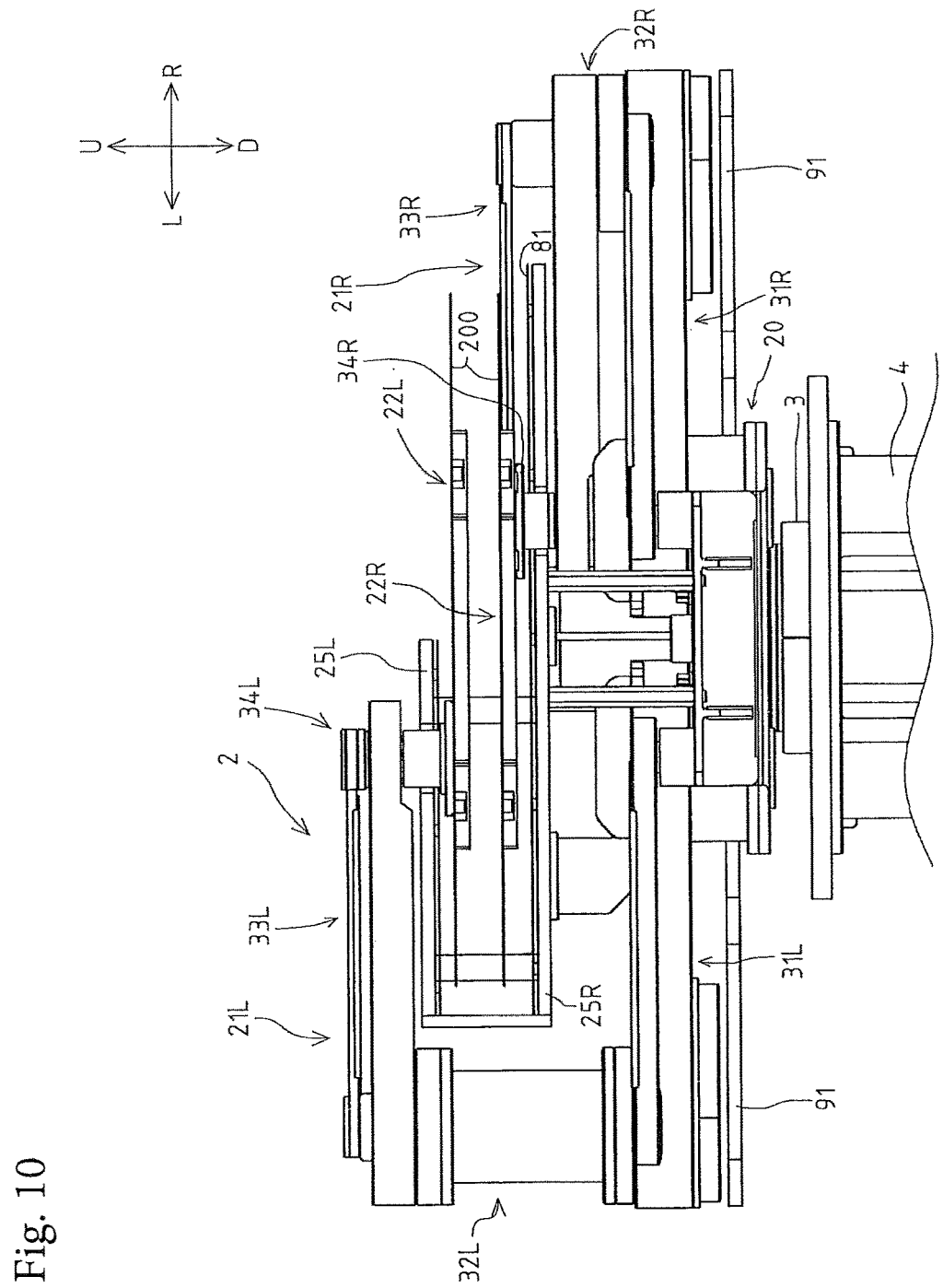
FIG. 10 is a front view of the carrier device according to the second embodiment.
Figure 11:
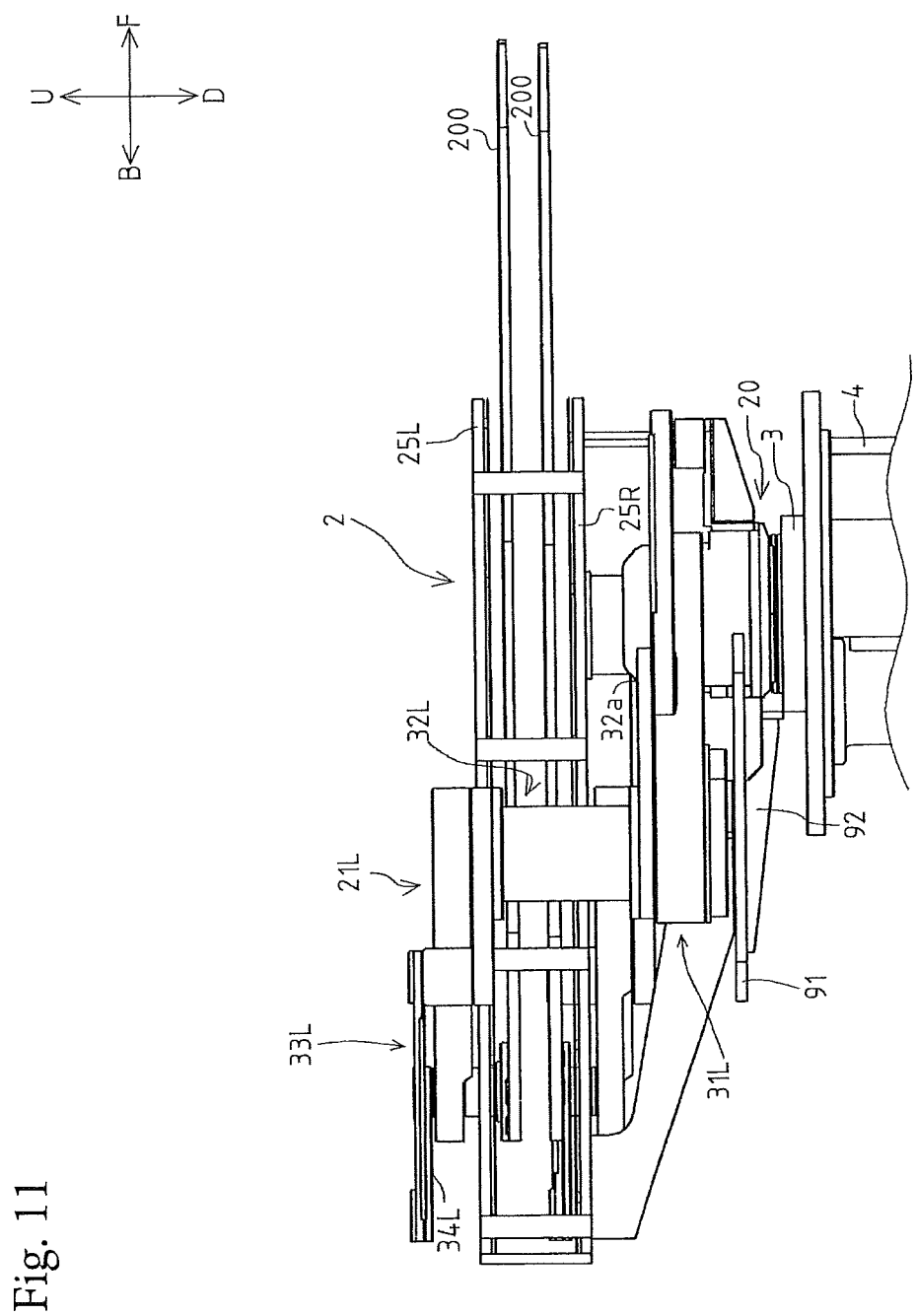
FIG. 11 is a left side view of the carrier device according to the second embodiment.

In addition, in another embodiment, as illustrated in FIG. 9 to FIG. 11, a lower side cooling plate 91 is provided on the lower sides of the left lower arm 31L and the right lower arm 31R. It is noted that the configuration of the carrier device 100 except for the lower side cooling plate 91 is similar to the configuration of the carrier device 100 described in the first embodiment, and the description is omitted.

Figure 12A:
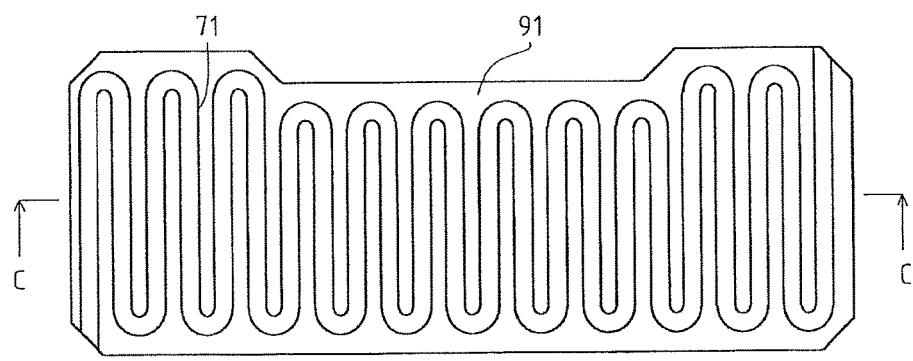
FIG. 12A is a plan view of a lower side cooling plate and FIG. 12B is a cross-sectional view of a C-C line.
Figure 12B:
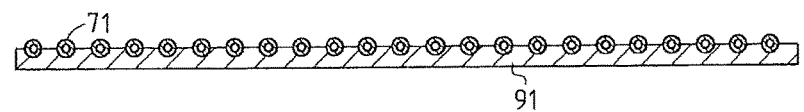

The lower side cooling plate 91 is a plate-like member and a member having a color that is easy to absorb heat such as a black color. In addition, the lower side cooling plate 91 is provided on the bottom surfaces of the left lower arm 31L and the right lower arm 31R. In addition, the configuration of the lower side cooling plate 91 is similar to the configuration of the left cooling plate 25L, and as illustrated in FIG. 12, the cooling path 71 is provided on the surface of the lower side cooling plate 91. The lower side cooling plate 91 is provided so that the cooling path 71 is located on the top surface of the lower side cooling plate 91. The cooling path 71 is bent in a zigzag and provided so as to cool the whole surface of the lower side cooling plate 91.

In addition, as illustrated in FIG. 7A, the cooling path 71 may be installed on the surface of the lower side cooling plate 91 by the attachment tool 72, similar to the cooling path 71 of the left cooling plate 25L. The filler 73 that is used to increase a heat transfer rate is filled in a space that is surrounded by the surface of the lower side cooling plate 91, the outer peripheral surface of the cooling path 71, the inner peripheral surface of the attachment tool 72. The cooling path 71 and the attachment tool 72 are bent in a zigzag and provided so as to cool the whole surface of the lower side cooling plate 91.

In addition, as illustrated in FIG. 7B, the cooling path 71 may be provided inside the lower side cooling plate 91. The cooling path 71 is bent in a zigzag and provided so as to cool the whole surface of the lower side cooling plate 91.

The lower side cooling plate 91 includes an area that includes all movement ranges of the left lower arm 31L and the right lower arm 31R in the planar view. The lower side cooling plate 91 is supported from below by a supporting member 92 that is provided to project from the rear surface of the bottom plate 41 of the pivot base 20.

Third Embodiment

Figure 13:
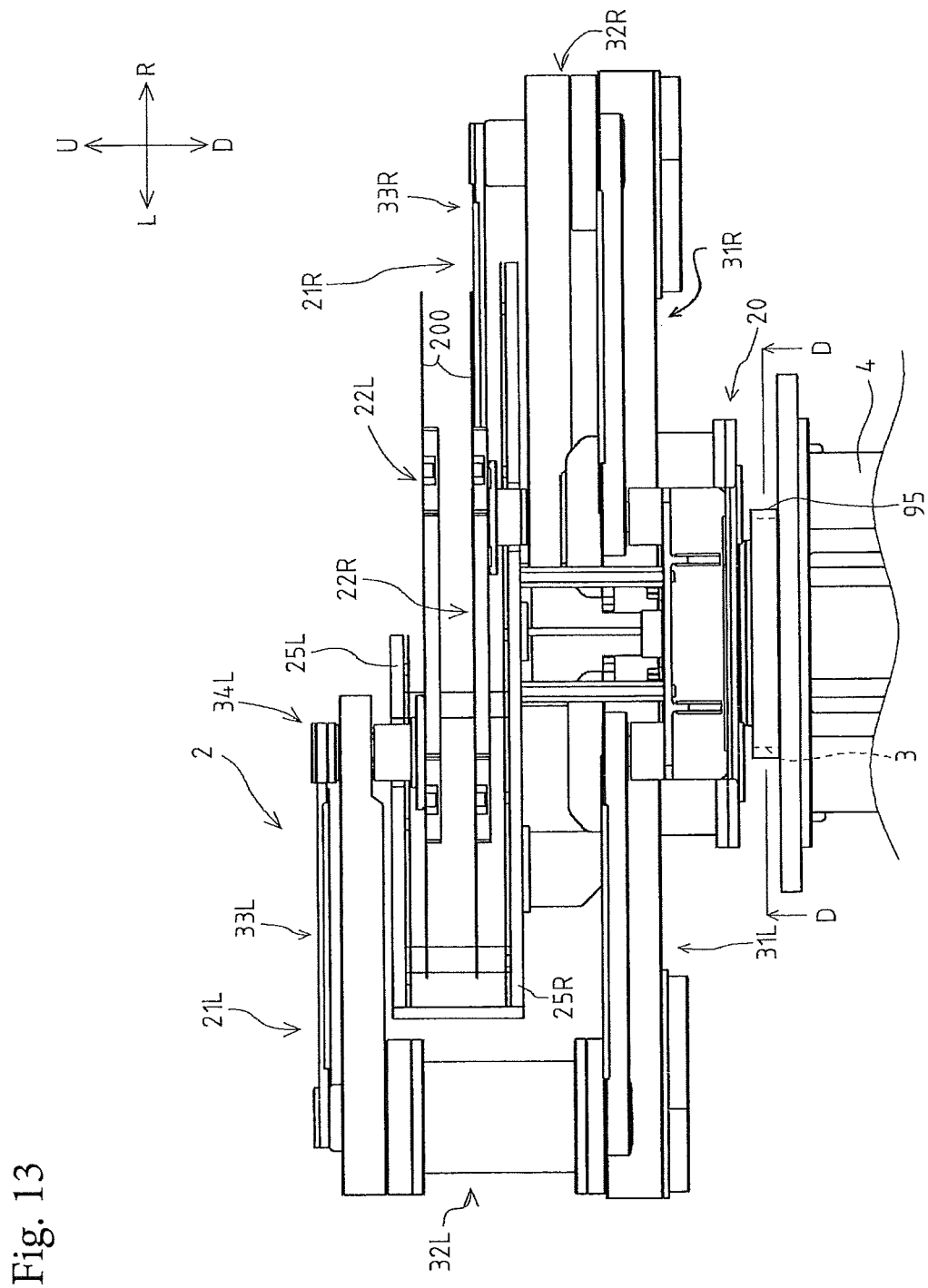
FIG. 13 is a front view of a carrier device according to a third embodiment.

In addition, in another embodiment, as illustrated in FIG. 13, a pivot shaft cooling plate 95 is provided around the pivot shaft 3. It is noted that the configuration of the carrier device 100 except for the pivot shaft cooling plate 95 is similar to the configuration of the carrier device 100 according to the first embodiment, and the description is omitted.

Figure 14:
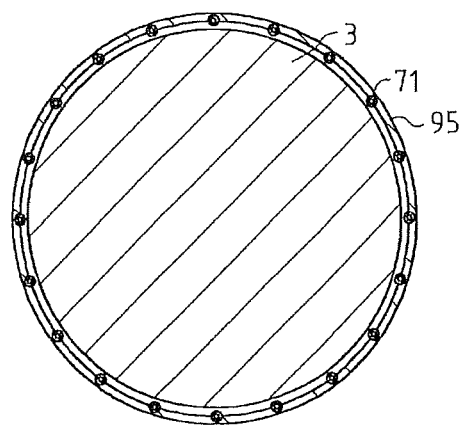
FIG. 14 is a cross-sectional view of a D-D line of a pivot shaft cooling plate.

The pivot shaft cooling plate 95 is formed into a shape in which a long plate is rounded annularly. The pivot shaft cooling plate 95 is a member having a color that is easy to absorb heat such as a black color. The configuration of the pivot shaft cooling plate 95 is similar to the configuration of the left cooling plate 25L, and as illustrated in FIG. 14, the cooling path 71 is provided on the surface of the pivot shaft cooling plate 95. The pivot shaft cooling plate 95 is provided so that the cooling path 71 is located on the inner surface of the pivot shaft cooling plate 95. The cooling path 71 is bent in a zigzag and provided so as to cool the whole inner surface of the pivot shaft cooling plate 95. The pivot shaft cooling plate 95 is stuck outside the pivot shaft 3.

In addition, as illustrated in FIG. 7A, the cooling path 71 may be installed on the surface of the pivot shaft cooling plate 95 by the attachment tool 72, similar to the cooling path 71 of the left cooling plate 25L. The filler 73 that is used to increase a heat transfer rate is filled in a space that is surrounded by the surface of the pivot shaft cooling plate 95, the outer peripheral surface of the cooling path 71, and the inner peripheral surface of the attachment tool 72. The cooling path 71 and the attachment tool 72 are bent in a zigzag and provided so as to cool the whole inner surface of the pivot shaft cooling plate 95.

In addition, as illustrated in FIG. 7B, the cooling path 71 may be provided inside the pivot shaft cooling plate 95. The cooling path 71 is bent in a zigzag and provided so as to cool the whole surface of the pivot shaft cooling plate 95.

As described above, the carrier device 100 includes the linkage arm mechanism 2 that is used to carry the work 200 in the vacuum space, and the pivot shaft 3 that pivotally supports the linkage arm mechanism 2 so that the linkage arm mechanism 2 can rotate around the vertical shaft, and the linkage arm mechanism 2 includes the lower arms 31L and 31R, the upper arms 33L and 33R the one ends of which are respectively connected to the lower arms 31L and 31R, and the horizontal movement members 22L and 22R that support the work 200 that is connected to the other ends of the upper arms 33L and 33R, and the cooling plates 25L and 25R are respectively provided between the upper arms 33L and 33R and the horizontal movement members 22L and 22R, and in the carrier device 100, the reflective materials 81 and 81 are stuck on the surfaces of the cooling plates 25L and 25R on the side of the horizontal movement members 22L and 22R.

By such a configuration, when the work 200 is mounted on the top surfaces of the horizontal movement members 22L and 22R, the upper arms 33L and 33R can be cooled by the cooling plates 25L and 25R by respectively providing the cooling plates 25L and 25R between the upper arms 33L and 33R of the linkage arm mechanism 2 and the works 200 and 200 in the high temperature state. More specifically, the left upper arm 33L can be cooled by the left cooling plate 25L by providing the left cooling plate 25L between the bottom surface of the left upper arm 33L and the work 200 that is mounted on the left horizontal movement member 22L. In addition, the right upper arm 33R can be cooled by the right cooling plate 25R by providing the right cooling plate 25R between the top surface of the third arm 53R of the right upper arm 33R and the work 200 that is mounted on the right horizontal movement member 22R. Thus, the impact of the radiation heat from the work 200 in the high temperature state can be reduced.

In addition, by such a configuration, the radiation heat from the work 200 can be reflected by sticking the reflective material 81 on the surface on the side in the vicinity of the work 200 in the high temperature state. Thus, the impact of the radiation heat from the work 200 in the high temperature state can be reduced.

In addition, in the carrier device 100, the lower side cooling plate 91 is provided on the lower sides of the lower arms 31L and 31R.

By such as configuration, even when the radiation heat from the work 200 in the high temperature state is reflected in the vacuum space and conveyed from the lower side of the linkage arm mechanism 2, the lower arms 31L and 31R can be cooled by the cooling plate by providing the lower side cooling plate 91 on the lower sides of the lower arms 31L and 31R of the linkage arm mechanism 2. Thus, the impact of the radiation heat from the work 200 in the high temperature state can be reduced.

In addition, in the carrier device 100, the pivot shaft cooling plate 95 is wound around the pivot shaft 3.

By such a configuration, the pivot shaft 3 that pivotally supports the linkage arm mechanism 2 can be cooled by the pivot shaft cooling plate 95. Thus, the impact of the radiation heat from the work 200 in the high temperature state can be reduced.

INDUSTRIAL APPLICABILITY

The present invention can be applied to a carrier device that is used to carry a substrate in a vacuum space.

DESCRIPTION OF THE REFERENCE NUMERAL

2 Linkage arm mechanism
3 Pivot shaft
21L Left linkage arm
21R Right linkage arm
22L Left horizontal movement member
22R Right horizontal movement member
25L Left cooling plate
25R Right cooling plate
31L Left lower arm
31R Right lower arm
32L Left intermediate linkage
32R Right intermediate linkage
33L Left upper arm
33R Right upper arm
71 Cooling path
81 Reflective material
91 Lower side cooling plate
95 Pivot shaft cooling plate

The invention claimed is:

1. A carrier device comprising:
a linkage arm mechanism that is used to carry a work in a vacuum space and
a pivot shaft that pivotally supports the linkage arm mechanism so that the linkage arm mechanism can rotate around a vertical shaft,
wherein the linkage arm mechanism includes a first linkage arm mechanism and a second linkage arm mechanism,
wherein the first linkage arm mechanism comprises first lower arm, first upper arm one end of which is connected to the first lower arm, and first horizontal movement member that supports the work that is connected to the other end of the first upper arm,
wherein a first cooling plate which is fixed so as to be rotated with the rotation of the pivot shaft is provided between the first upper arm and the first horizontal movement member, and separated from the first upper arm and the first horizontal movement member and,
wherein the first cooling plate comprises a passing groove so as to pass a connecting means between the first upper arm and the first horizontal movement member when the first linkage arm mechanism is moved,
wherein the second linkage arm mechanism comprises second lower arm, second upper arm one end of which is connected to the second lower arm, and second horizontal movement member that supports the work that is connected to the other end of the second upper arm,
wherein a second cooling plate which is fixed so as to be rotated with the rotation of the pivot shaft is provided between the second upper arm and the second horizontal movement member, and separated from the second upper arm and the second horizontal movement member and,
wherein the second cooling plate comprises a passing groove so as to pass a connecting means between the second upper arm and the second horizontal movement member when the second linkage arm mechanism is moved.

2. The carrier device according to claim 1, wherein the second cooling plate is provided between the first lower arm and the first horizontal movement member, and separated from the first lower arm and the first horizontal movement member.

3. The carrier device according to claim 1, wherein the first cooling plate is connected to the second cooling plate.

4. The carrier device according to claim 1, wherein the second horizontal movement member is provided closer to a pivot shaft side than the first horizontal movement member.

5. The carrier device according to claim 1, wherein a reflective material is stuck on a surface of the first cooling plate on the first horizontal movement member side.

6. The carrier device according to claim 1, wherein a reflective material is stuck on a surface of the second cooling plate on the second horizontal movement member side.

7. The carrier device according to claim 1, wherein a cooling plate of the pivot shaft is wound around the pivot shaft.

8. A carrier device comprising: a linkage arm mechanism that is used to carry a work in a vacuum space; and
a pivot shaft that pivotally supports the linkage arm mechanism so that the linkage arm mechanism can rotate around a vertical shaft,
wherein the linkage arm mechanism comprises lower arms, upper arms one ends of which are connected to the lower arms, and horizontal movement members that support the work that is connected to the other ends of the upper arms,
wherein a first cooling plate which is fixed so as to be rotated with the rotation of the pivot shaft is provided between the upper arms and the horizontal movement members, and separated from the upper arms and the horizontal movement members,
wherein the first cooling plate comprises a passing groove so as to pass a connecting means between the upper arms and the horizontal movement members when the linkage arm mechanism is moved, and
wherein reflective materials are stuck on surfaces of the first cooling plate on the horizontal movement member side.

9. The carrier device according to claim 8, wherein a cooling plate of the pivot shaft is wound around the pivot shaft.

* * * * *